United States Patent
Song et al.

(10) Patent No.: US 9,691,720 B2
(45) Date of Patent: Jun. 27, 2017

(54) MULTI-LAYER GROUND SHIELD STRUCTURE OF INTERCONNECTED ELEMENTS

(71) Applicant: QUALCOMM Incorporated, San Diego, CA (US)

(72) Inventors: Young Kyu Song, San Diego, CA (US); Uei-Ming Jow, San Jose, CA (US); Jong-Hoon Lee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/809,983

(22) Filed: Jul. 27, 2015

(65) Prior Publication Data

US 2017/0033059 A1    Feb. 2, 2017

(51) Int. Cl.
*H01L 23/58* (2006.01)
*H01L 49/02* (2006.01)
*H01L 21/765* (2006.01)

(52) U.S. Cl.
CPC .......... *H01L 23/585* (2013.01); *H01L 21/765* (2013.01); *H01L 28/10* (2013.01); *H01L 2224/16225* (2013.01); *H01L 2924/15311* (2013.01)

(58) Field of Classification Search
CPC ...... H01L 23/585; H01L 21/765; H01L 28/10
See application file for complete search history.

(56) References Cited

U.S. PATENT DOCUMENTS

| | | | |
|---|---|---|---|
| 6,905,889 B2 | 6/2005 | Lowther | |
| 8,559,186 B2 | 10/2013 | Jin | |
| 2002/0096736 A1* | 7/2002 | Brennan | ............. H01L 23/5227 257/531 |
| 2006/0254814 A1 | 11/2006 | Sze et al. | |
| 2013/0147023 A1* | 6/2013 | Lin | ..................... H01L 23/5225 257/659 |
| 2014/0117496 A1 | 5/2014 | Cheng et al. | |
| 2014/0284762 A1 | 9/2014 | Yeh | |
| 2014/0361417 A1* | 12/2014 | Liu | ..................... H01L 23/5227 257/659 |

* cited by examiner

*Primary Examiner* — Moazzam Hossain
*Assistant Examiner* — Farun Lu
(74) *Attorney, Agent, or Firm* — Toler Law Group, PC.

(57) ABSTRACT

A multi-layer ground shield structure of interconnected elements is disclosed. The ground shield structure may include a first patterned layer of a ground shield structure, a second patterned layer of the ground shield structure, and a spacer between the first patterned layer and the second patterned layer. The first patterned layer includes first conductive elements interconnected within the first patterned layer according to a first pattern. The second patterned layer includes second conductive elements interconnected within the second patterned layer according to a second pattern.

30 Claims, 8 Drawing Sheets

MULTI-LAYER GROUND SHIELD STRUCTURE OF INTERCONNECTED ELEMENTS

I. FIELD

The present disclosure is generally related to a multi-layer ground shield structure of interconnected elements.

II. DESCRIPTION OF RELATED ART

Advances in technology have resulted in smaller and more powerful computing devices. For example, a variety of portable personal computing devices, including wireless telephones, such as mobile and smart phones, tablets and laptop computers, are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing capabilities.

Electronic devices may include passive components, such as inductors, resistors, and capacitors, which are widely used in tuning, filtering, impedance matching, and gain control of circuits. Passive components can be used with or formed on an integrated circuit (IC) along with active components (e.g., transistors).

In some electronic devices, signals or noise generated by a first component can be coupled into a nearby structure (e.g., a substrate or another component). Additionally, signals or noise of the nearby structure may affect the first component. Further, a parasitic capacitance between the first component and the nearby structure may introduce an unwanted coupling of signals.

A ground plane (e.g., a conductive layer) may be used to provide isolation to reduce signal interference between the first component and the nearby structure. Time-varying currents flowing through the first component can induce eddy currents in the ground plane causing losses associated with the induced eddy currents. As an alternative to the ground plane, a patterned ground shield (PGS) may be used. The PGS may avoid losses associated with induced eddy currents but may provide significantly less isolation than a ground plane.

III. SUMMARY

In a particular aspect, a ground shield structure includes a spacer that is located between a first patterned layer of the ground shield structure and a second patterned layer of the ground shield structure. The first patterned layer includes first conductive elements interconnected within the first patterned layer according to a first pattern. The second patterned layer includes second conductive elements interconnected within the second patterned layer according to a second pattern.

In another particular aspect, a computer-readable medium stores instructions that are executable by a processor to perform operations. The operations include initiating formation of a first patterned layer of a ground shield structure, the first patterned layer including first conductive elements interconnected within the first patterned layer according to a first pattern. The operations further include initiating formation of a second patterned layer of the ground shield structure, the second patterned layer including second conductive elements interconnected within the second patterned layer according to a second pattern.

In another particular aspect, a ground shield structure includes means for conducting charge. The means for conducting charge includes a first layer of interconnected elements and a second layer of interconnected elements. The first layer of interconnected elements and the second layer of interconnected elements are configured to electrically shield the first structure from an electric field associated with the second structure. The ground shield structure further includes means for impeding conduction of charge. The means for impeding conduction of charge is located between the first layer of interconnected elements and the second layer of interconnected elements.

In a particular aspect, a method of forming a ground shield structure is disclosed. The method includes forming a first patterned layer of the ground shield structure, the first patterned layer including first conductive elements interconnected within the first patterned layer according to a first pattern. The method also includes forming a second patterned layer of the ground shield structure, the second patterned layer including second conductive elements interconnected within the second patterned layer according to a second pattern. A spacer is formed between the first patterned layer and the second patterned layer.

One particular advantage provided by at least one of the disclosed aspects is that a ground shield structure including multiple layers of interconnected conductive elements may be positioned between a first structure (e.g., an inductor) and a second structure (e.g., a substrate) in an electronic device to attenuate signal interference or coupling between the first and second structures. The disclosed ground shield structures may provide better electrical isolation than single layer PGS. Additionally, the disclosed ground shield structures may generate reduced eddy currents as compared to a ground plane.

Other aspects, advantages, and features of the present disclosure will become apparent after review of the entire application, including the following sections: Brief Description of the Drawings, Detailed Description, and the Claims.

V. DETAILED DESCRIPTION

Figure 1:
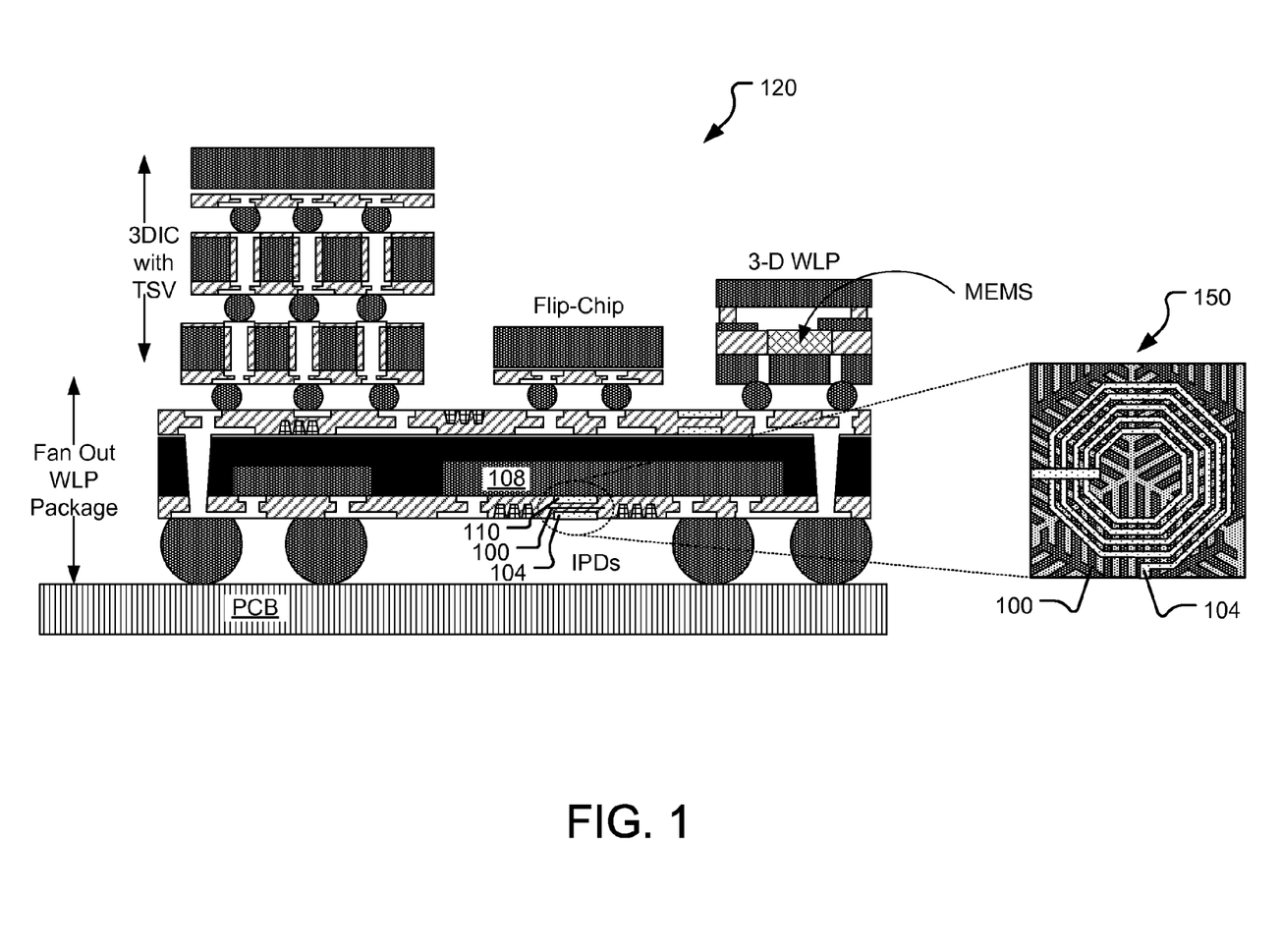
FIG. 1 is a diagram showing a particular example of an electronic device including a ground shield structure.

FIG. 1 depicts a particular illustrative example of an electronic device 120 that includes a ground shield structure 100. The ground shield structure 100 may provide electromagnetic energy attenuation (e.g., isolation) between components or structures of the electronic device 120. For example, the ground shield structure 100 may be located between a first component, such as an inductor 104, and an adjacent structure, such as a substrate 108 of the electronic device 120. In other examples, the ground shield structure 100 may be located between other components or structures of the electronic device 120, based on specific design criteria. For instance, the ground shield structure 100 may be positioned between the inductor 104 and another component of the electronic device, such as a component 110 corresponding to a transistor.

A cutout blowup view 150 in FIG. 1 shows a plan view of the ground shield structure 100 positioned adjacent to the inductor 104. A central region of the ground shield structure 100 may be aligned with a central region of the inductor 104. Additionally, a periphery of the ground shield structure 100 may correspond in size and/or shape to a size and/or shape of a periphery of the inductor 104. The ground shield structure 100 may have various patterns as described further with reference to FIGS. 2A, 2B, 3A and 3B.

In FIG. 1, the ground shield structure 100 includes multiple layers of interconnected conductive elements. The substrate 108 may include a semiconductor, glass, polymer, or other substrate within the electronic device 120. The inductor 104 may include a planar inductor, such as a spiral inductor, that is arranged and positioned generally parallel to the ground shield structure 100 and to a surface of the substrate 108. According to an aspect of the disclosure, the ground shield structure 100 may serve to electrically isolate the inductor 104 from the substrate 108 and to attenuate effects of parasitic capacitance between the inductor 104 and the substrate 108, thereby improving performance of the electronic device 120. For example, the ground shield structure 100 may be coupled to a ground of the electronic device 120 at multiple locations, as described further below. Thus, the ground shield structure 100 may provide a path to ground for an electric field associated with the inductor 104 (or an electric field associated with another component of the electronic device 120), thereby providing electrical isolation between the inductor 104 and the other component.

In FIG. 1, the electronic device 120 is illustrated as including particular components, such as a three-dimensional (3D) integrated circuit (IC) stack interconnected using through-silicon vias (TSV), a flip chip, a 3D wafer level package (WLP) stack, a microelectromechanical structure (MEMS), a fan out WLP package, integrated passive devices (IDPs), and a printed circuit board (PCB). The specific components of the electronic device 120 illustrated in FIG. 1 are only to provide general context for the ground shield structure 100. In other implementations, the ground shield structure 100 may be part of or used with a different electronic device that includes more components, fewer components, or different components. Additionally, in other implementations, the ground shield structure 100 may be located between other components of the electronic device 120.

Figure 2A:
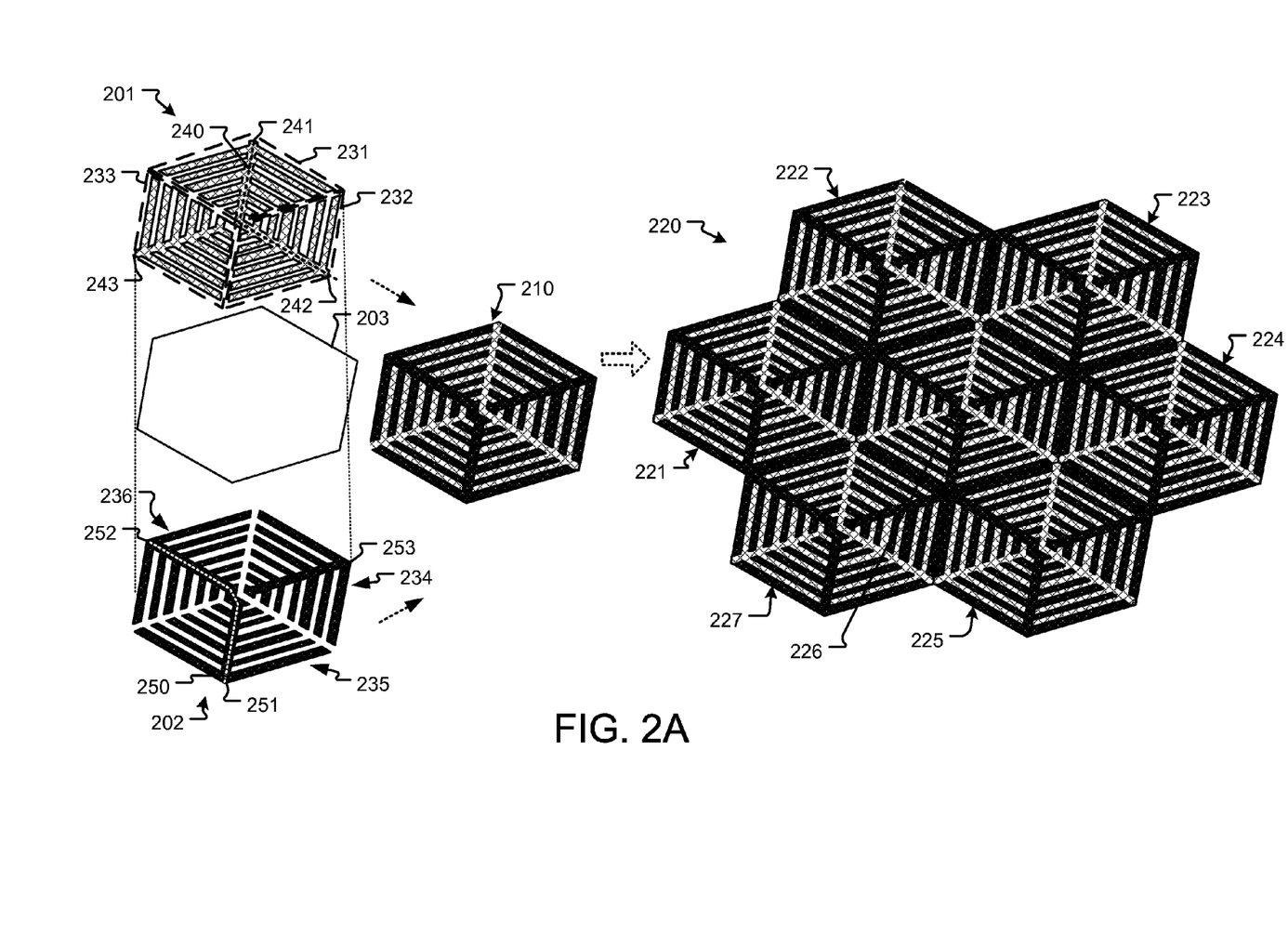
FIG. 2A is a diagram showing a first particular example of a ground shield structure that includes multiple patterned layers.

FIG. 2A is a diagram showing a first particular example of a ground shield structure 210 in a perspective view. The ground shield structure 210 may include, correspond to, or be included within the ground shield structure 100 of FIG. 1.

As shown in FIG. 2A, the ground shield structure 210 includes a first patterned layer 201 of first conductive elements and a second patterned layer 202 of second conductive elements. For example, the first patterned layer 201 includes a set of generally rectangular conductive elements that are arranged in several tapering fishbone shapes (e.g., shapes 231, 232, and 233 outlined in dashed lines in FIG. 2A). Each of the tapering fishbone shapes includes multiple conductive elements (e.g., "ribs") projecting outward from a central conductive element (e.g., a "spine"). Conductive elements of two or more of the tapering fishbone shapes (such as a first shape 231 and a second shape 232) are electrically interconnected to one another at a central region of the first patterned layer 201. Conductive elements of at least one of the tapering fishbone shapes (such as a third shape 233) are not electrically connected to the other tapering fishbone shapes (e.g., the first shape 231 and the second shape 232). Similarly, the second patterned layer 202 includes a set of generally rectangular conductive elements that are arranged in several tapering fishbone shapes (such as shapes 234, 235, and 236). Conductive elements of two or more of the tapering fishbone shapes (such as a first shape 235 and a second shape 236) of the second patterned layer 202 are electrically interconnected to one another at a central region of the second patterned layer 202. Conductive elements of at least one of the tapering fishbone shapes (such as a third shape 234) are not electrically connected to the other tapering fishbone shapes (e.g., the first shape 235 and the second shape 236).

Electrical interconnection of two or more of the conductive elements at the central region provides a conductive path within each patterned layer 201, 202 from one tapering fishbone shape to another. To illustrate, a first conductive path 240 (shown as a dotted line in FIG. 2A) extends between a first portion 241 (e.g., a first side or vertex) of the first patterned layer 201 and a second portion 242 (e.g., a second side or vertex) of the first patterned layer 201. As explained above, the third shape 233 is not electrically connected to the first shape 235 and the second shape 232. Accordingly, there is no conductive path in the first patterned layer 201 from the first portion 241 or the second portion 242 to the third portion 243 (e.g. a third side or vertex) of the first patterned layer 201. A second conductive path 250 (shown as a dotted line in FIG. 2A) extends between a first portion 251 (e.g., a first side or vertex) of the second patterned layer 202 and a second portion 252 (e.g., a first side or vertex) of the second patterned layer 202. As explained above, the third shape 234 is not electrically connected to the first shape 235 and the second shape 236. Accordingly, there is no conductive path in the second patterned layer 202 from the first portion 251 or the second portion 252 to the third portion 253 (e.g. a third side or vertex) of the second patterned layer 202.

The first conductive path 240 may include a first conductive element that is coupled to, includes, or is included within the first portion 241 and may include a second conductive element that is coupled to, includes, or is included within the second portion 242. The first conductive element and the second conductive element may be connected at the central region (e.g., a midpoint between the first conductive element and the second conductive element) of the first patterned layer 201. Similarly, the second conductive path 250 may include a third conductive element that is coupled to, includes, or is included within the first portion 251 of the second patterned layer 202 and may include a fourth conductive element that is coupled to, includes, or is included within the second portion 252 of the second patterned layer 202. The third conductive element and the fourth conductive element may be connected at the central region (e.g., a midpoint between the third conductive element and the fourth conductive element) of the second patterned layer 202. The first conductive element and the second conductive element may extend radially or approximately radially from the central region of the first patterned layer 201, and the third conductive element and the fourth conductive element may extend radially or approximately radially from the central region of the second patterned layer 202.

The first patterned layer 201 and the second patterned layer 202 may be formed of or include a first conductive material and a second conductive material, respectively. Each of the first conductive material and the second conductive material may include, for example, a metal material (e.g., copper, aluminum, or gold) or a doped or highly-doped polysilicon material. The first conductive material and the second conductive material may be the same or may be different from each other.

In a particular aspect, each of the first conductive elements of the first patterned layer 201 is a segment of conductive material separated from an adjacent conductive element by a space, which is a non-conductive region. Each segment of the first patterned layer 201 may have a first width and a first thickness. Similarly, each of the second conductive elements of the second patterned layer 202 is a segment of conductive material separated from an adjacent conductive element by a space, which is a non-conductive region. Each segment of the second patterned layer 202 may have a second width and a second thickness. The first width and the second width may be substantially the same (e.g., equal or approximately equal), or the first and second width may be different from one another. Likewise, the first thickness and the second thickness may be substantially the same (e.g., equal or approximately equal), or the first and second thickness may be different from one another. In another particular aspect, conductive elements of a single layer (e.g., the first patterned layer 201 or the second patterned layer 202) may be different from one another. To illustrate, conductive elements closer to a periphery of the first patterned layer 201 may have different widths than conductive elements closer to the central region of the first patterned layer 201.

A spacer 203 may be located between the first patterned layer 201 and the second patterned layer 202. For example, the first patterned layer 201 may be formed on a first side of the spacer 203, and the second patterned layer 202 may be formed on a second side of the spacer 203. The spacer 203 may separate the first patterned layer 201 from the second patterned layer 202, and may provide insulation (e.g., electrical isolation) between the first conductive elements of the first patterned layer 201 and the second conductive elements of the second patterned layer 202. The spacer 203 may include, for example, a layer of first material having a lower conductivity than a conductivity of the first conductive material and a lower conductivity than a conductivity of the second conductive material. For example, the spacer 203 may include an insulating material (e.g., a dielectric). To illustrate, the spacer 203 may include silicon oxide, silicon nitride, silicon oxy-nitride, fluoride-doped silicate (FSG), a glass, a polymer, a low-k dielectric material, or a combination thereof.

According to a particular aspect, the first conductive elements of the first patterned layer 201 and the second conductive elements of the second patterned layer 202 are substantially (e.g., within manufacturing tolerances) complementary (e.g., having an inverse arrangement of conductive elements). For example, in a plan view (e.g., an overhead view) of the ground shield structure 210, spaces between conductive elements of the first patterned layer 201 are substantially coextensive with (e.g., are aligned and have the same size, shape and position as) the conductive elements of the second patterned layer 202. Likewise, in the plan view, spaces between conductive elements of the second patterned layer 202 are substantially coextensive with (e.g., are aligned and have the same size, shape and position as) the conductive elements of the first patterned layer 201. In a particular aspect, conductive elements of the patterned layer 201 and 202 may be formed such that the conductive elements of the patterned layer 201 and 202 overlap one another slightly in the plan view to accommodate manufacturing tolerance and alignment tolerances.

Thus, in the plan view, the ground shield structure 210 may have substantially no regions (e.g., points) that are not covered (e.g., crossed or occupied) by at least one conductive element. In this respect, the ground shield structure 210 may resemble a ground plane, except that, as explained further below, conductive paths between various points are arranged to reduce eddy currents. Additionally, depending on manufacturing tolerances, the ground shield structure 210 may have substantially no regions that are covered (e.g., crossed or occupied) by multiple conductive elements (e.g., no regions that are overlapped with two conductive elements).

Figure 2B:
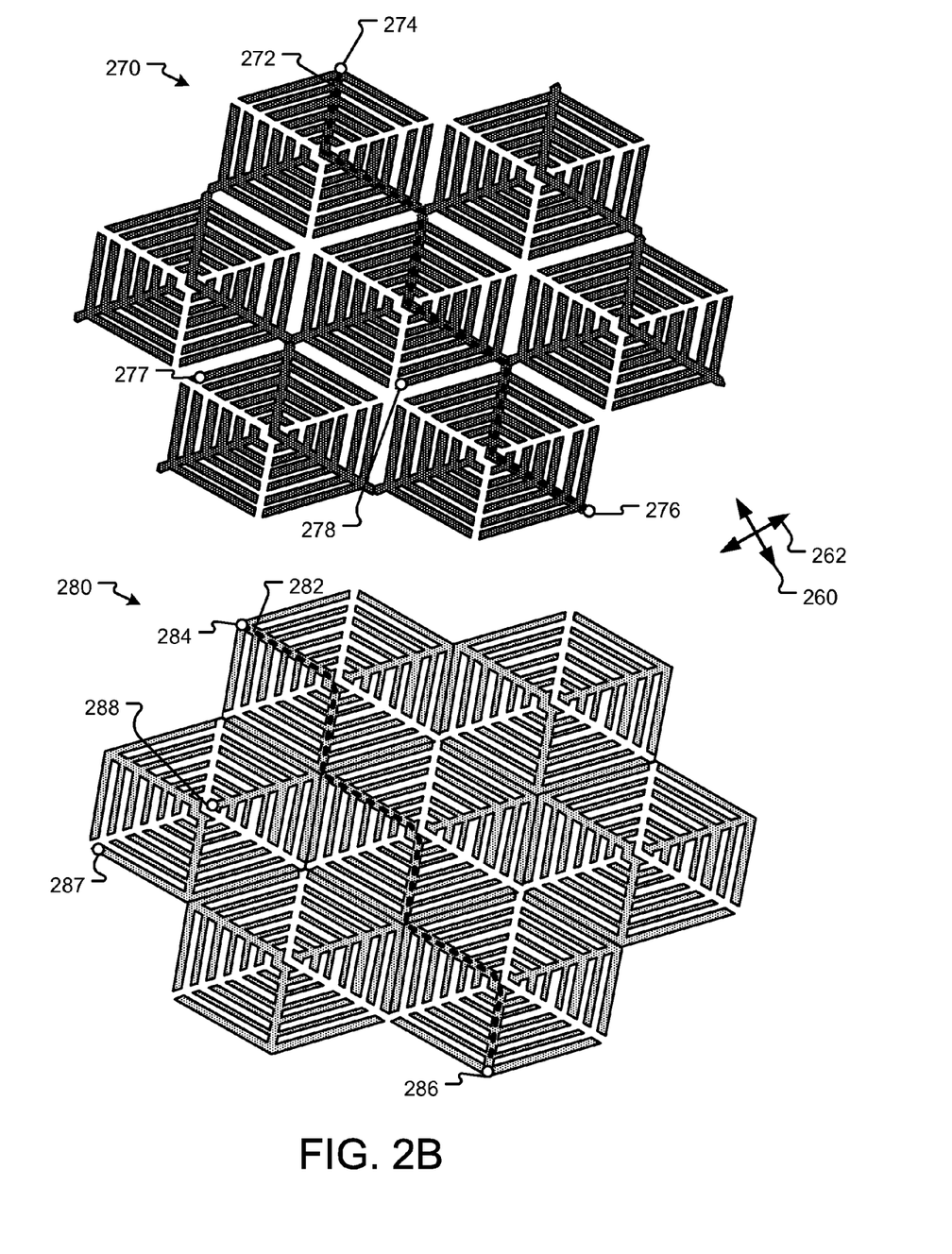
FIG. 2B is another diagram showing a first layer and a second layer of the ground shield structure according to the first particular example.
Figure 3A:
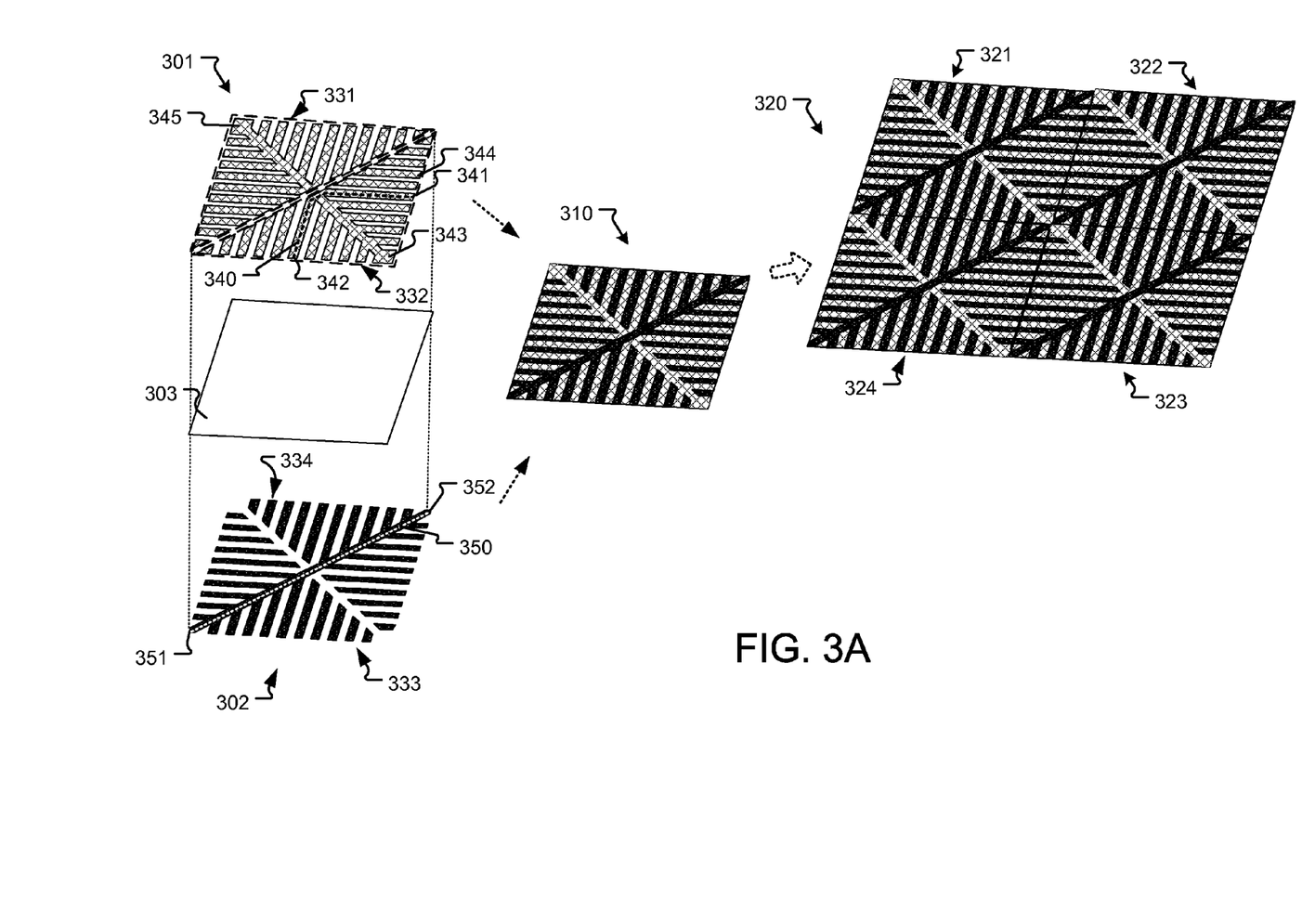
FIG. 3A is a diagram showing a second particular example of a ground shield structure that includes multiple patterned layers.
Figure 3B:
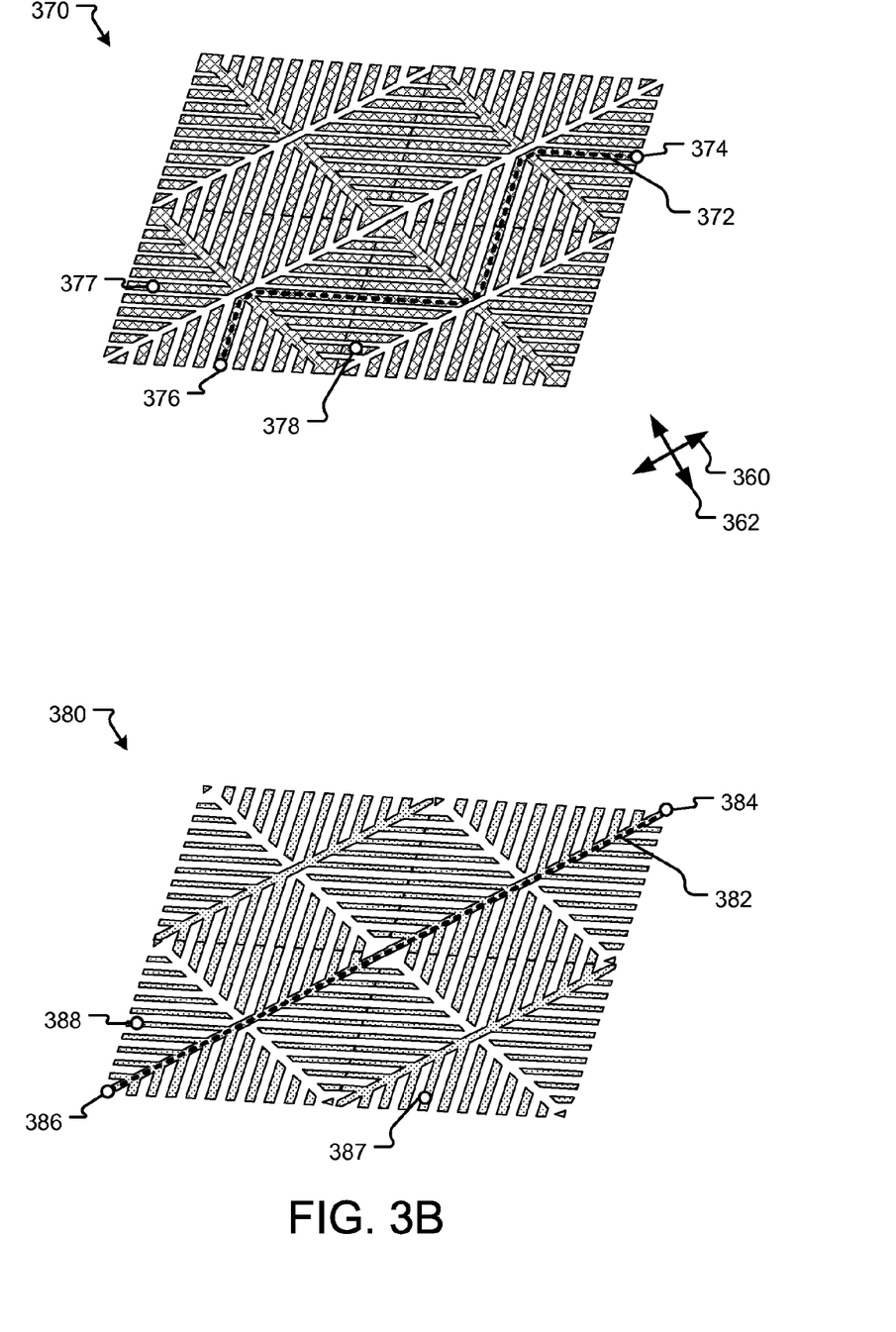
FIG. 3B is another diagram showing a first layer and a second layer of the ground shield structure according to the second particular example.

In a particular aspect, multiple instances of the ground shield structure 210 may be connected together as unit cells 221-227 of a larger ground shield structure 220. For example, the first patterned layer 201 may define a plurality of a first cells (as illustrated by a first layer 270 of FIG. 2B), and the second patterned layer 202 may define a plurality of second cells (as illustrated by a second layer 280 of FIG. 2B). Perimeters of the first cells may be shaped to enable tiling (e.g., regular tessellation) of the first cells, and perimeters of the second cells may be shaped to enable tiling (e.g., regular tessellation) of the second cells. For example, in FIG. 2A, the perimeter of each unit cell 221-227 is hexagonal. FIGS. 3A and 3B illustrate another example in which a perimeter of each unit cell is a square. Although FIGS. 2A and 2B show the larger ground shield structure 220 including seven interconnected unit cells, in other examples, the larger ground shield structure 220 may include more than seven or fewer than seven unit cells. For example, the ground shield structure 210 may include or correspond to a single unit cell, and the larger ground shield structure 220 may include or correspond to two or more unit cells.

The unit cells 221-227 may be arranged and interconnected (e.g., electrically) such that each patterned layer forms a conductive path between edges of the larger ground shield structure 220. For example, FIG. 2B illustrates the first layer 270 of the larger ground shield structure 220 and the second layer 280 of the larger ground shield structure 220 separated from one another. As shown in FIG. 2B, the first layer 270 may provide a conductive path 272 that traverses the larger ground shield structure 220 generally in a first direction 260. Although only one conductive path is highlighted in the first layer 270 of FIG. 2B, a conductive path generally along the first direction 260 is provided for each unit cell of the first layer 270. One or more ground connections 274, 276 may be coupled to each conductive path of the first layer 270.

The first layer 270 does not provide a conductive path that traverses the larger ground shield structure 220 in a second direction 262. Thus, for example, an eddy current induced at or near a point 277 cannot flow to the ground connections 274, 276 via the first layer 270 (although the eddy current may flow to another ground connection that is not illustrated). However, an eddy current induced at or near a point 278 can flow to the ground connections 274, 276 via the first layer 270. Limiting free propagation of eddy current may reduce eddy current losses.

FIG. 2B also shows that the second layer 280 may provide a conductive path 282 that traverses the larger ground shield structure 220 generally in the first direction 260. Although only one conductive path is highlighted in the second layer 280 of FIG. 2B, a conductive path generally along the first direction 260 is provided for each unit cell of the second layer 280. One or more ground connections 284, 286 may be coupled to each conductive path of the second layer 280.

The second layer 280 does not provide a conductive path that traverses the larger ground shield structure 220 in the second direction 262. Thus, for example, an eddy current induced at or near a point 287 cannot flow to the ground connections 284, 286 via the second layer 280 (although the eddy current may flow to another ground connection that is not illustrated). However, an eddy current induced at or near a point 288 can flow to the ground connections 284, 286 via the second layer 280.

Thus, while each conductive element of the larger ground shield structure 220 is coupled to ground, eddy currents within the larger ground shield structure 220 are not able to propagate freely, as in a ground plane, since the conductive paths of the larger ground shield structure 220 do not allow current to propagate in particular directions, such as in the second direction 262. Accordingly, the ground shield structures 210 and/or 220 of FIGS. 2A and 2B provide electrical isolation similar to a ground plane while reducing eddy current losses relative to eddy current losses associated with ground planes.

FIGS. 3A and 3B illustrate a second example of a ground shield structure 310 that includes multiple patterned layers. The ground shield structure 310 may include, correspond to, or be included within the ground shield structure 100 of FIG. 1.

As shown in FIG. 3A, the ground shield structure 310 includes a first patterned layer 301 of first conductive elements and a second patterned layer 302 of second conductive elements. For example, the first patterned layer 301 includes a set of generally rectangular conductive elements that are arranged in several shapes 331, 332 (outlined in dashed lines in FIG. 3A). Each shape 331, 332 of the first patterned layer 301 has a triangular perimeter, with multiple conductive elements (e.g., "ribs") projecting outward relative to a central conductive element (e.g., a "spine"). In FIG. 3A, each of the shapes 331, 332 of the first patterned layer 301 includes several conductive elements that are connected to the central conductive element and includes several conductive elements that are not connected to the central conductive element. For example, a first conductive element 341 and a second conductive element 342 of a first shape 332 of the first patterned layer 301 are each connected to a central conductive element 343 of the first shape 332; however, a third conductive element 344 is not connected to the central conductive element 343. Each conductive element that is connected to the central conductive element provides a portion of a conductive path from one side of the shape to another side of the shape. To illustrate, the first conductive element 341 and the second conductive element 342 provide a conductive path 340 that extends between two portions of the first shape 332. The first shape 332 of the first patterned layer 301 may be electrically isolated from a second shape 331 of the first patterned layer 301. To illustrate, a non-conductive region may separate the central conductive element 343 of the first shape 332 from a central conductive element 345 of the second shape 331.

The second patterned layer 302 is generally an inverse pattern of the first patterned layer 301. Thus, for example, conductive regions (corresponding to conductive elements) of the first patterned layer 301 correspond to non-conductive regions of the second patterned layer 302. Likewise, non-conductive regions of the first patterned layer 301 correspond to conductive regions (corresponding to conductive elements) of the second patterned layer 302. Accordingly, the second patterned layer 302 may include a conductive path 350 that joins a central conductive element 351 of a first shape 333 of the second patterned layer 302 and a central conductive element 352 of a second shape 334 of the second patterned layer 302.

The first patterned layer 301 and the second patterned layer 302 may be formed of or include a first conductive material and a second conductive material, respectively. Each of the first conductive material and the second conductive material may include, for example, a metal material (e.g., copper, aluminum, or gold) or a doped or highly-doped polysilicon material. The first conductive material and the second conductive material may be the same or may be different from each other.

In a particular aspect, each of the first conductive elements of the first patterned layer 301 is a segment of conductive material separated from an adjacent conductive element by a space, which is a non-conductive region. Each segment of the first patterned layer 301 may have a first width and a first thickness. Similarly, each of the second conductive elements of the second patterned layer 302 is a segment of conductive material separated from an adjacent conductive element by a space, which is a non-conductive region. Each segment of the second patterned layer 302 may have a second width and a second thickness. The first width and the second width may be substantially the same (e.g., equal or approximately equal), or the first and second width may be different from one another. Likewise, the first thickness and the second thickness may be substantially the same (e.g., equal or approximately equal), or the first and second thickness may be different from one another. In another particular aspect, conductive elements of a single layer (e.g., the first patterned layer 301 or the second patterned layer 302) may be different from one another. To illustrate, conductive elements closer to a periphery of the first patterned layer 301 may have different widths than conductive elements closer to a central region of the first patterned layer 301.

A spacer 303 may be located between the first patterned layer 301 and the second patterned layer 302. For example, the first patterned layer 301 may be formed on a first side of the spacer 303, and the second patterned layer 302 may be formed on a second side of the spacer 303. The spacer 303 may separate the first patterned layer 301 from the second patterned layer 302 and may provide insulation (or electrical isolation) between the first conductive elements of the first patterned layer 301 and the second conductive elements of the second patterned layer 302. The spacer 303 may include, for example, a layer of first material having a lower conductivity than a conductivity of the first conductive material and a lower conductivity than a conductivity of the second conductive material. For example, the spacer 303 may include a first insulating material (e.g., a first dielectric). To illustrate, the spacer 303 may include silicon oxide, silicon nitride, silicon oxy-nitride, fluoride-doped silicate (FSG), a glass, a polymer, a low-k dielectric material, or a combination thereof.

The first conductive elements of the first patterned layer 301 and the second conductive elements of the second patterned layer 302 are substantially (e.g., within manufacturing tolerances) complementary (e.g., having an inverse arrangement of conductive elements). For example, in a plan view (e.g., an overhead view) of the ground shield structure 310, spaces between conductive elements of the first patterned layer 301 are substantially coextensive with (e.g., are aligned and have the same size, shape and position as) the conductive elements of the second patterned layer 302. Likewise, in the plan view, spaces between conductive elements of the second patterned layer 302 are substantially coextensive with (e.g., are aligned and have the same size, shape and position as) the conductive elements of the first patterned layer 301. In a particular aspect, conductive elements of the patterned layer 301 and 302 may be formed such that the conductive elements of the patterned layer 301 and 302 overlap one another slightly in the plan view to accommodate manufacturing tolerance and alignment tolerances.

Thus, in the plan view, the ground shield structure 310, may have substantially no regions (e.g., points) that are not covered (e.g., crossed or occupied) by at least one conductive element. In this respect, the ground shield structure may resemble a ground plane, except that, as explained further below, conductive paths between various points are arranged to reduce eddy currents. Additionally, depending on manufacturing tolerances, the ground shield structure 310 may have substantially no regions that are covered (e.g., crossed or occupied) by multiple conductive elements (e.g., no regions that are overlapped with two conductive elements).

In a particular aspect, multiple instances of the ground shield structure 310 may be connected together as unit cells 321-324 of a larger ground shield structure 320. For example, the first patterned layer 301 may define a plurality of first cells (as illustrated by a first layer 370 of FIG. 3B), and the second patterned layer 302 may define a plurality of second cells (as illustrated by a second layer 380 of FIG. 3B). Perimeters of the first cells may be shaped to enable tiling (e.g., regular tessellation) of the first cells, and perimeters of the second cells may be shaped to enable tiling (e.g., regular tessellation) of the second cells. For example, in FIG. 3A, the perimeter of each unit cell is a square. Although FIGS. 3A and 3B show the larger ground shield structure 320 including four interconnected unit cells, in other examples, the larger ground shield structure 320 may include more than four or fewer than four unit cells. For example, the ground shield structure 310 may include or correspond to a single unit cell, and the larger ground shield structure 320 may include or correspond to two or more unit cells.

The unit cells 321-324 may be arranged and interconnected (e.g., electrically) such that each patterned layer forms a conductive path between edges of the larger ground shield structure 320. For example, FIG. 3B illustrates the first layer 370 of the larger ground shield structure 320 and the second layer 380 of the larger ground shield structure 220 separated from one another. As shown in FIG. 3B, the first layer 370 may provide a conductive path 372 that traverses (e.g., crosses from one side to another side of) the larger ground shield structure 320 generally in a first direction 360. Although only one conductive path 372 is called out in the first layer 370 of FIG. 3B, a conductive path generally along a first direction 360 is provided for each unit cell of the first layer 370. One or more ground connections 374, 376 may be coupled to each conductive path of the first layer 370.

The first layer 370 does not provide a conductive path that traverses (e.g., crosses from one side to another side of) the larger ground shield structure 320 in a second direction 362. Thus, for example, an eddy current induced at or near a point 377 cannot flow to the ground connections 374, 376 via the first layer 370 (although the eddy current may flow to another ground pin that is not illustrated). However, an eddy current induced at or near a point 378 can flow to the ground connections 374, 376 via the first layer 370.

FIG. 3B also shows that the second layer 380 may provide a conductive path 382 that traverses the larger ground shield structure 320 generally in the first direction 360. Although only one conductive path 382 is called out in the second layer 380 of FIG. 3B, a conductive path generally along the first direction 360 is provided for each unit cell of the second layer 380. One or more ground connections 384, 286 may be coupled to each conductive path of the second layer 380.

The second layer 380 does not provide a conductive path that traverses (e.g., crosses from one side to another side of) the larger ground shield structure 320 in the second direction 362. Thus, for example, an eddy current induced at or near a point 387 cannot flow to the ground connections 384, 386 via the second layer 380 (although the eddy current may flow to another ground pin that is not illustrated). However, an eddy current induced at or near a point 388 can flow to the ground connections 384, 386 via the second layer 380.

Thus, while each conductive element of the larger ground shield structure 320 is coupled to ground, eddy currents within the larger ground shield structure 320 are not able to propagate freely, as in a ground plane, since the conductive paths of the larger ground shield structure 320 do not allow current to propagate in particular directions, such as in the second direction 362. Accordingly, the ground shield structures 310 and/or 320 of FIGS. 3A and 3B provide electrical isolation similar to a ground plane while reducing eddy current losses relative to eddy current losses associated with ground planes.

Figure 4:
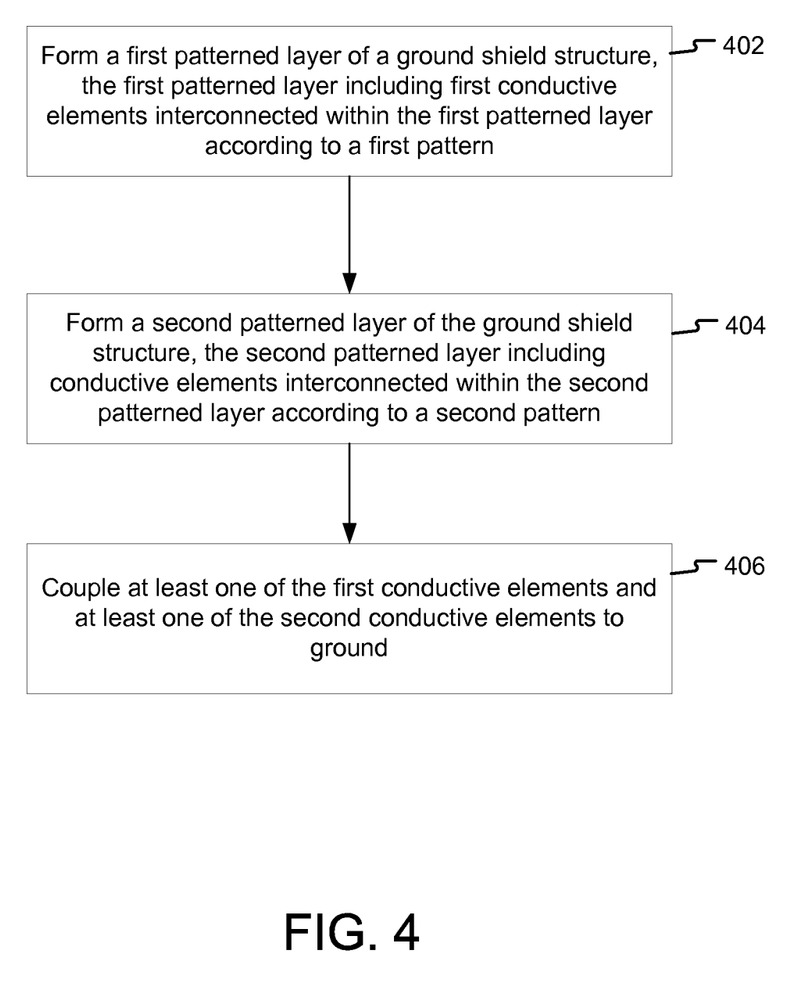
FIG. 4 is a flow chart of a particular illustrative example of a method of forming a ground shield structure that includes multiple patterned layers of interconnected elements.

Referring to FIG. 4, a particular illustrative example of a method of fabricating a ground shield structure is depicted and generally designated 400. The ground shield structure may correspond to the ground shield structure 100 of FIG. 1, the ground shield structure 210 or the larger ground shield structure 220 of FIG. 2A, or the ground shield structure 310 or the larger ground shield structure 320 of FIG. 3A. The method 400 is depicted using a simplified flowchart. Each step or operation depicted in FIG. 4 may include multiple sub-steps or sub-operations.

The method 400 includes forming a first patterned layer, at 402. For example, the first patterned layer may be formed on (e.g., in direct contact with) a first side of a spacer. To illustrate, the first patterned layer may be printed, deposited, or formed by another additive process on the spacer. In other examples, the first patterned layer may be formed and then applied to the spacer. The first patterned layer may include first conductive elements that are interconnected within the first patterned layer according to a first pattern. For example, the first patterned layer may include or correspond to the first patterned layer 201 of FIG. 2A, the first layer 270 of FIG. 2B, the first patterned layer 301 of FIG. 3A, or the first layer 370 of FIG. 3B.

The method 400 may further include forming a second patterned layer, at 404. For example, the second patterned layer may be formed on (e.g., in direct contact with) a second side of the spacer. To illustrate, the second patterned layer may be printed, deposited, or formed by another additive process on the spacer. In other examples, the second patterned layer may be formed and then applied to the spacer. The second patterned layer may include second conductive elements that are interconnected within the second patterned layer according to a second pattern. For example, the second patterned layer may include or correspond to the second patterned layer 202 of FIG. 2A, the second layer 280 of FIG. 2B, the second patterned layer 302 of FIG. 3A, or the second layer 380 of FIG. 3B.

The method 400 further includes coupling at least one of the first conductive elements and at least one of the second conductive elements to ground, at 406. For example, coupling at least one of the first conductive elements and at least one of the second conductive elements to ground may include forming at least one via between the ground and at least one of the first patterned layer and the second patterned layer and filling the via with a metal. To illustrate, at least one of the first conductive elements may be coupled to a ground connection (which is coupled to ground) as described with respect to FIGS. 2B and 3B.

The method 400 may further include, for example, forming a structure or a component, such as a spiral inductor, and positioning the ground shield structure relative to the structure or component. To illustrate, the ground shield structure may be positioned to isolate the structure or component from adjacent structures or components. As an example, the ground shield structure may be positioned between a first structure and a second structure to provide a path to ground for electric fields associated with the first structure or the second structure.

One or more operations of the method 400 may be initiated, controlled, or performed by an electronic device. The electronic device may include a field-programmable gate array (FPGA) device, an application-specific integrated circuit (ASIC), a processing unit such as a central processing unit (CPU), a digital signal processor (DSP), a controller, another hardware device, a firmware device, or any combination thereof. In a particular example, a computer-readable medium stores instructions that are executable by a processor to initiate the operations of the method 400.

Figure 5:
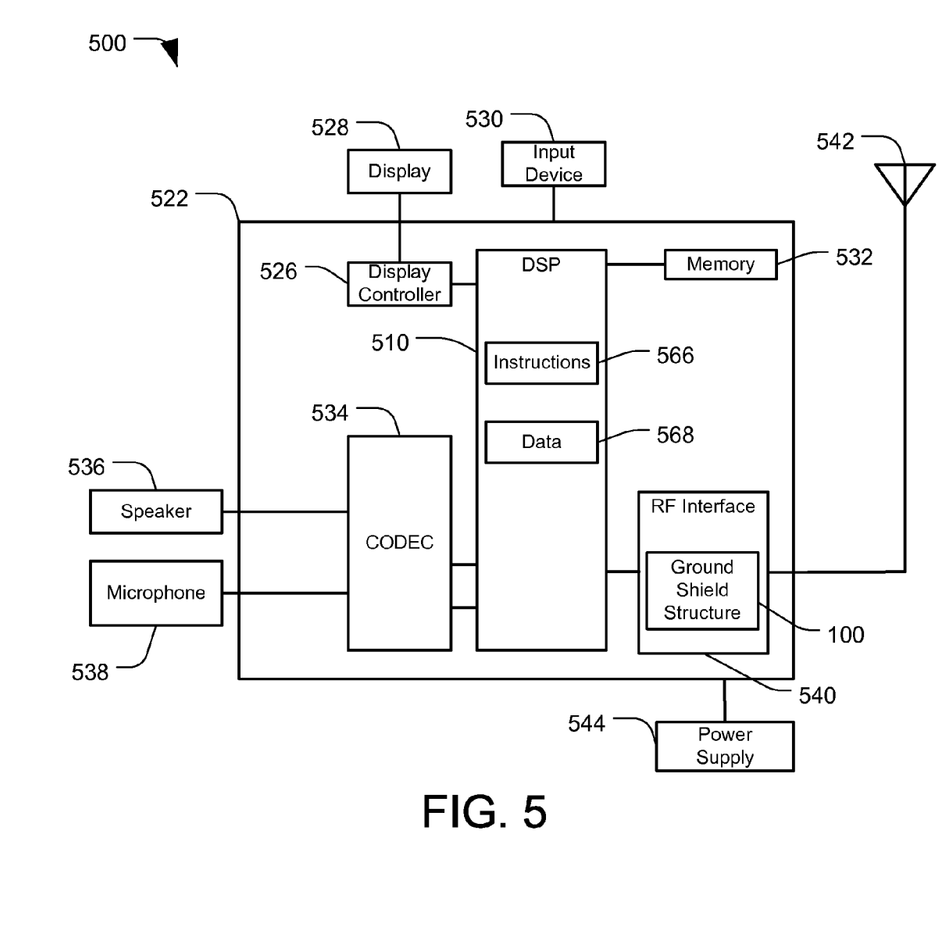
FIG. 5 is a block diagram of an electronic device including a ground shield structure.

Referring to FIG. 5, a particular aspect of a device is depicted and generally designated 500. In a particular example, the device 500 may include or correspond to a mobile device that operates to communicate via a wireless communication network. In other examples, the device 500 may include or correspond to a computer, a set top box, a music player, a video player, an entertainment unit, a navigation device, a communications device, a personal digital assistant (PDA), a fixed location data unit, or another electronic device.

The device 500 includes a processor 510, such as a digital signal processor (DSP). The processor 510 is coupled to a memory 532. The processor 510 may read and write instructions 566 and/or data 568 at the memory 532. For example, the processor 510 may store the instructions 566 and/or the data 568 at the memory 532. As another example, the processor 510 may access the instructions 566 and/or the data 568 from the memory 532.

FIG. 5 also shows a display controller 526 that is coupled to the processor 510 and to a display 528. A coder/decoder (CODEC) 534 can also be coupled to the processor 510. A speaker 536 and a microphone 538 can be coupled to the CODEC 534.

The device 500 may include a radio frequency (RF) interface 540. The RF interface 540 may be connected to an antenna 542 and to the processor 510. The RF interface 540 includes a ground shield structure 100. The ground shield structure 100 may include or correspond to one or more of the ground shield structure 210 of FIG. 2A, the larger ground shield structure 220 of FIG. 2A, or the ground shield structure 310 of FIG. 3A, or the larger ground shield structure 320 of FIG. 3A. For example, the RF interface 540 may include a first component, such as the inductor 104 of FIG. 1, and an adjacent structure. In this example, the ground shield structure 100 may provide electrical isolation between the first component and the adjacent structure. Although the ground shield structure 100 is illustrated as part of the RF interface 540 in FIG. 5, in other implementations, the ground shield structure 100 (or another ground shield structure) may also (or in the alternative) be integrated within another component or device, such as within the CODEC 534, a power supply 544, or the display controller 526, as illustrative examples.

In a particular implementation, the processor 510, the display controller 526, the memory 532, the CODEC 534, and the RF interface 540 are included in a system-in-package or system-on-chip device 522. An input device 530 and the power supply 544 may be coupled to the system-on-chip device 522. Moreover, as illustrated in FIG. 5, the display 528, the input device 530, the speaker 536, the microphone 538, the antenna 542, and the power supply 544 may be external to the system-on-chip device 522. However, each of the display 528, the input device 530, the speaker 536, the microphone 538, the antenna 542, and the power supply 544 can be coupled to a component of the system-on-chip device 522, such as to an interface or to a controller.

In conjunction with the described aspects, a device or apparatus is disclosed for attenuating one or more of signal interference or coupling or transmission of electromagnetic energy between structures of an electronic device. The device or apparatus may include or correspond to a ground shield structure. The ground shield structure may include means for conducting charge, such as conductive elements of the ground shield structures 210 and 220 of FIG. 2A or the ground shield structures 310 and 320 of FIG. 3A. The means for conducting charge may include a first layer of interconnected elements, such as the first patterned layer 201 of FIG. 2A, the first layer 270 of FIG. 2B, the first patterned layer 301 of FIG. 3A or the first layer 370 of FIG. 3B. The means for conducting charge may also include a second layer of interconnected elements, such as the second patterned layer 202 of FIG. 2A, the second layer 280 of FIG. 2B, the second patterned layer 302 of FIG. 3A, or the second layer 380 of FIG. 3B. As described above, the first layer of interconnected elements and the second layer of interconnected elements may be configured to electrically shield the first structure from an electric field associated with the second structure. The ground shield structure may further include means for impeding conduction of charge, such as the spacer 203 of FIG. 2A or the spacer 303 of FIG. 3A. Thus, as described above, the ground shield structure may provide electrical isolation similar to a ground plane while reducing eddy current losses relative to eddy current losses associated with ground planes.

Figure 6:
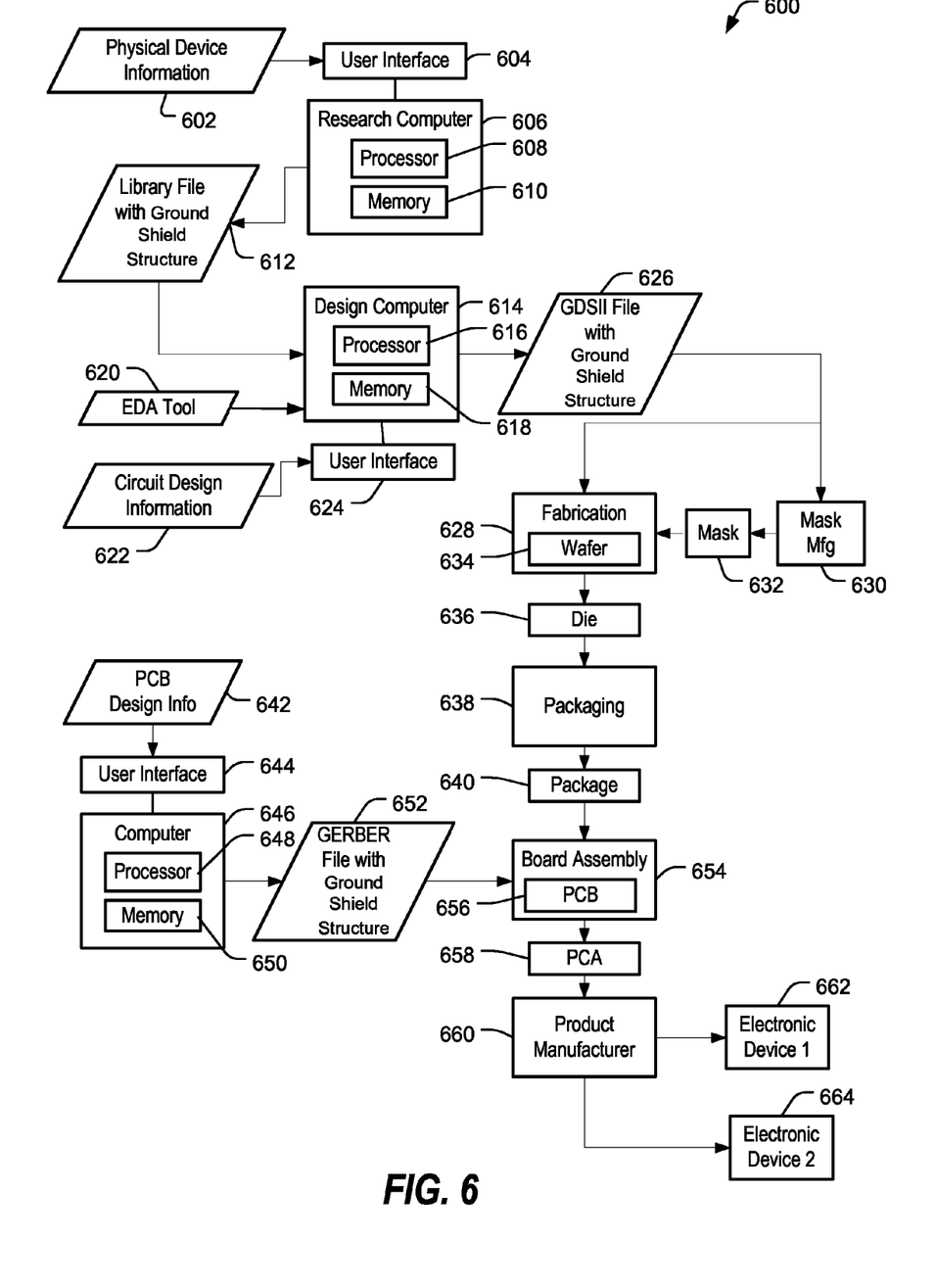
FIG. 6 is a data flow diagram of a particular illustrative example of a manufacturing process to manufacture electronic devices that include a ground shield structure.

The foregoing disclosed devices and functionalities described with respect to FIGS. 1-5 may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into dies and packaged into chips. The chips may then be employed in devices, such as devices within the electronic device 500 of FIG. 5. FIG. 6 depicts a particular illustrative example of an electronic device manufacturing process 600.

Referring to FIG. 6, physical device information 602 is received at the manufacturing process 600, such as at a research computer 606. The physical device information 602 may include design information specifying a ground shield structure device. The ground shield structure device may correspond to one or more of the ground shield structure 100 of FIG. 1, the ground shield structures 210 or 220 of FIG. 2A, or the ground shield structures 310 or 320 of FIG. 3A.

The physical device information 602 may indicate one or more physical parameters, material characteristics, and structure information entered via a user interface 604 coupled to the research computer 606. The research computer 606 includes a processor 608, such as one or more processing cores, coupled to a computer readable medium, such as a memory 610. The memory 610 may store computer readable instructions that are executable to cause the processor 608 to transform the physical device information 602 to comply with a file format and to generate a library file 612.

In a particular implementation, the library file 612 includes at least one data file including the transformed design information. For example, the library file 612 may specify a library of semiconductor devices including a ground shield structure device. The ground shield structure device may correspond to one or more of the ground shield structure 100 of FIG. 1, the ground shield structures 210 or 220 of FIG. 2A, or the ground shield structures 310 or 320 of FIG. 3A.

The library file 612 may be used in conjunction with the EDA tool 620 at a design computer 614. The design computer 614 includes a processor 616 (e.g., one or more processing cores) coupled to a memory 618. The EDA tool 620 may include processor executable instructions stored at the memory 618 to enable a user of the design computer 614 to design a circuit including one or more of the ground shield structure 100 of FIG. 1, the ground shield structures 210 or 220 of FIG. 2A, or the ground shield structures 310 or 320 of FIG. 3A. For example, a user of the design computer 614 may enter circuit design information 622 via a user interface 624 coupled to the design computer 614. The circuit design information 622 may include design information representing at least one physical property of one or more of the ground shield structure 100 of FIG. 1, the ground shield structures 210 or 220 of FIG. 2A, or the ground shield structures 310 or 320 of FIG. 3A. To illustrate, the circuit design information 622 may identify particular circuits and relationships to other elements in a circuit design, positioning information, feature size information, interconnection information, or other information representing a physical property of a device (e.g., a semiconductor device).

The design computer 614 may be configured to transform the design information (including the circuit design information 622) to comply with a file format. To illustrate, the file format may include a database binary file format representing planar geometric shapes, text labels, and other information related to a circuit layout in a hierarchical format, such as a Graphic Data System (GDSII) file format. The design computer 614 may be configured to generate a data file including the transformed design information, such as a GDSII file 626. The GDSII file 626 may include information describing a ground shield structure device (in addition to other circuits or information). The ground shield structure device may correspond to one or more of the ground shield structure 100 of FIG. 1, the ground shield structures 210 or 220 of FIG. 2A, or the ground shield structures 310 or 320 of FIG. 3A.

The GDSII file 626 may be received at a fabrication process 628 to manufacture one or more of the ground shield structure 100 of FIG. 1, the ground shield structures 210 or 220 of FIG. 2A, or the ground shield structures 310 or 320 of FIG. 3A according to transformed information in the GDSII file 626. For example, a device manufacture process may include providing the GDSII file 626 to a mask manufacturer 630 to create one or more masks, such as masks to be used with photolithography processing, illustrated as a representative mask 632. The mask 632 may be used during the fabrication process to generate one or more wafers 634, which may be tested and separated into dies, such as a representative die 636. The die 636 includes a circuit having one or more of the ground shield structure 100 of FIG. 1, the ground shield structures 210 or 220 of FIG. 2A, or the ground shield structures 310 or 320 of FIG. 3A.

To further illustrate, a processor and a memory may initiate and/or control the fabrication process 628. The memory may include instructions, such as computer-readable instructions or processor-readable instructions. The instructions may be executable by the processor. The instructions may be executable by the processor to initiate operations of the method 400 of FIG. 4. In a particular example, the instructions are executable by the processor to perform operations including initiating formation of a first patterned layer, such as described with reference to 402 of FIG. 4, initiating formation a second patterned layer, such as described with reference to 404 of FIG. 4, and initiating coupling at least one of the first conductive elements and at least one of the second conductive elements to ground, such as described with reference to 406 of FIG. 4.

The fabrication process 628 may be implemented by a fabrication system that is fully automated or partially automated. For example, the fabrication process 628 may be automated according to a schedule. The fabrication system may include fabrication equipment (e.g., processing tools) to perform one or more operations to form a device. For example, the fabrication equipment may be configured to deposit one or more materials, epitaxially grow one or more materials, conformally deposit one or more materials, apply a hardmask, apply an etching mask, perform etching, perform planarization, and/or perform a wafer cleaning process, etc. For example, the fabrication equipment may be configured to deposit one or more materials using chemical vapor deposition (CVD) and/or physical vapor deposition (PVD), pattern materials using a single-mask or multi-mask litho-etch process (e.g., two-mask LELE), pattern materials using a litho-freeze-litho-etch (LFLE) process, pattern materials using a self-aligned double patterning (SADP) process, epitaxially grow one or more materials, conformally deposit one or more materials, apply a hardmask, apply an etching mask, perform etching, perform planarization, form a dummy gate stack, form a gate stack, perform a standard clean 1 type, etc.

The fabrication system may have a distributed architecture (e.g., a hierarchy). For example, the fabrication system may include one or more processors, such as the processor, one or more memories, and/or one or more controllers that are distributed according to the distributed architecture. The distributed architecture may include a high-level processor that controls or initiates operations of one or more low-level systems. For example, a high-level processor may include one or more processors and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level system. Each of the one or more low-level systems may be associated with one or more corresponding pieces of fabrication equipment (e.g., processing tools). In a particular aspect, the fabrication system may include multiple processors that are distributed in the fabrication system. For example, a controller of a low-level system component may include a processor.

Alternatively, the processor may be a part of a high-level system, subsystem, or component of the fabrication system. In another aspect, the processor initiates or controls distributed processing operations associated with multiple levels and components of a fabrication system.

Thus, the processor may access processor-executable instructions that, when executed by the processor, cause the processor to initiate or control formation of a device. The device may include one or more materials formed using one or more doping tools, such as a molecular beam epitaxial growth tool, a flowable chemical vapor deposition (FCVD) tool, a conformal deposition tool, and/or a spin-on deposition tool. During fabrication of the device, one or more materials may be removed (e.g., etched) from the device using one or more removal tools, such as a chemical removal tool, a reactive gas removal tool, a hydrogen reaction removal tool, a planarization tool, and/or a standard clean 1 type removal tool.

The executable instructions included in the memory may enable the processor to initiate or control formation of a device or structure described herein. For example, the executable instructions may enable the processor to initiate or control formation of one or more of the ground shield structure 100 of FIG. 1, the ground shield structures 210 or 220 of FIG. 2A, or the ground shield structures 310 or 320 of FIG. 3A.

The die 636 may be provided to a packaging process 638 where the die 636 is incorporated into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor executable instructions at the memory 650 to process PCB design information 642 received from a user of the computer 646 via a user interface 644. The PCB design information 642 may include physical positioning information of a packaged device on a circuit board. The packaged device may correspond to the package 640, and the package 640 may include one or more of the ground shield structure 100 of FIG. 1, the ground shield structures 210 or 220 of FIG. 2A, or the ground shield structures 310 or 320 of FIG. 3A.

The computer 646 may be configured to transform the PCB design information 642 to generate a data file, such as a GERBER file 652, with data that includes physical positioning information of a packaged semiconductor device on a circuit board, as well as layout of electrical connections, such as traces and vias. The packaged semiconductor device may correspond to the package 640 and may include one or more of the ground shield structure 100 of FIG. 1, the ground shield structures 210 or 220 of FIG. 2A, or the ground shield structures 310 or 320 of FIG. 3A. In other examples, the data file generated by the transformed PCB design information may have a format other than a GERBER format.

The GERBER file 652 may be received at a board assembly process 654 and may be used to create PCBs, such as a representative PCB 656, manufactured in accordance with the design information stored within the GERBER file 652. For example, the GERBER file 652 may be uploaded to one or more machines to perform various steps of a PCB production process. The PCB 656 may be populated with electronic components including the package 640 to form a representative printed circuit assembly (PCA) 658.

The PCA 658 may be received at a product manufacture process 660 and integrated into one or more electronic devices, such as a first representative electronic device 662 and a second representative electronic device 664. As an illustrative, non-limiting example, the first representative electronic device 662, the second representative electronic device 664, or both, may be selected from the group of a mobile device, a computer, a set top box, a music player, a video player, an entertainment unit, a navigation device, a communications device, a personal digital assistant (PDA), or a fixed location data unit, into which one or more of the ground shield structure 100 of FIG. 1, the ground shield structures 210 or 220 of FIG. 2A, or the ground shield structures 310 or 320 of FIG. 3A may be integrated. As another illustrative, non-limiting example, one or more of the electronic devices 662 and 664 may include mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. It should be appreciated that the disclosure is not limited to these illustrated devices.

A device that includes one or more of the ground shield structure 100 of FIG. 1, the ground shield structures 210 or 220 of FIG. 2A, or the ground shield structures 310 or 320 of FIG. 3A may be fabricated, processed, and incorporated into an electronic device, as described in the illustrative process 600. One or more aspects described herein may be included at various processing stages, such as within the library file 612, the GDSII file 626, and the GERBER file 652, as well as stored at the memory 610 of the research computer 606, the memory 618 of the design computer 614, the memory 650 of the computer 646, the memory of one or more other computers or processors (not shown) used at the various stages, such as at the board assembly process 654. One or more aspects described herein may be incorporated into one or more other physical systems or devices, such as the mask 632, the die 636, the package 640, the PCA 658, other products such as prototype circuits or devices (not shown), or any combination thereof. Although various representative stages of production from a physical device design to a final product are depicted, in other examples fewer stages may be used or additional stages may be included. Similarly, the process 600 may be performed by a single entity or by one or more entities performing various stages of the process 600.

Those of skill would further appreciate that the various illustrative logical blocks, configurations, modules, circuits, and algorithm steps described in connection with the aspects disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the disclosed subject matter may be embodied directly in hardware, in a software module executed by a processor, or in a combination of the two. For example, one or more operations of the method 400 of FIG. 4 may be initiated, controlled, or performed using a processor that executes instructions. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed aspects is provided to enable a person skilled in the art to make or use the disclosed subject matter. Various modifications will be readily apparent to those skilled in the art, and the principles defined herein may be applied to other examples without departing from the scope of the present disclosure. Thus, the present disclosure is not intended to be limited to the aspects and examples shown herein but is to be accorded the widest scope possible consistent with the principles and novel features as defined by the following claims.

What is claimed is:

1. A device comprising:
a first patterned layer of a ground shield structure, the first patterned layer including first conductive elements electrically interconnected within the first patterned layer according to a first pattern, wherein a particular conductive element of the first conductive elements is connected to at least two other conductive elements of the first conductive elements;
a second patterned layer of the ground shield structure, the second patterned layer including second conductive elements electrically interconnected within the second patterned layer according to a second pattern, wherein the first pattern and the second pattern are complementary patterns; and
a spacer between the first patterned layer and the second patterned layer.

2. The device of claim 1, wherein the first conductive elements are electrically interconnected to provide a first conductive path from a first side of the first patterned layer to a second side of the first patterned layer, and wherein the first conductive path extends across the first patterned layer.

3. The device of claim 2, wherein the first conductive elements are electrically interconnected such that no conductive path extends between the first side of the first patterned layer and a third side of the first patterned layer, and wherein the third side is adjacent to the first side and adjacent to the second side.

4. The device of claim 1, wherein the second conductive elements are electrically interconnected to provide a second conductive path that extends between a first side of the second patterned layer and a second side of the second patterned layer, and wherein the second conductive elements are electrically interconnected such that no conductive path extends between the first side of the second patterned layer and a third side of the second patterned layer.

5. The device of claim 1, wherein the first patterned layer further includes third conductive elements, wherein at least one conductive element of the third conductive elements is electrically isolated from the first conductive elements.

6. The device of claim 1, wherein the first patterned layer includes a first plurality of first unit cells and the second patterned layer includes a second plurality of second unit cells.

7. The device of claim 6, wherein each of the first unit cells and each of the second unit cells has a rectangular shape.

8. The device of claim 6, wherein each of the first unit cells and each of the second unit cells has a hexagonal shape.

9. The device of claim 6, wherein multiple unit cells of the first plurality of unit cells are electrically interconnected to provide a first conductive path that extends across the multiple unit cells between a first side of the first patterned layer and a second side of the first patterned layer.

10. The device of claim 9, wherein multiple second unit cells of the second plurality of unit cells are electrically interconnected to provide a second conductive path that extends across the multiple second unit cells between a first side of the second patterned layer and a second side of the second patterned layer.

11. The device of claim 10, wherein the first conductive path extends generally in a particular direction across the first patterned layer and the second conductive path extends generally in the particular direction across the first patterned layer.

12. The device of claim 10, further comprising a ground connection coupled to the first conductive path and a second ground connection coupled to the second conductive path.

13. The device of claim 1, wherein the spacer comprises a dielectric material, and wherein the spacer electrically isolates the first patterned layer from the second patterned layer.

14. The device of claim 1, further comprising an apparatus in which the first patterned layer and the second patterned layer are integrated, wherein the apparatus comprises a mobile phone, a computer, a set top box, a music player, a video player, an entertainment unit, a navigation device, a communications device, a personal digital assistant (PDA), or a fixed location data unit.

15. The device of claim 1, further comprising a first component on a first side of the ground shield structure and a second component of a second side of the ground shield structure, wherein the ground shield structure provides electrical isolation between the first component and the second component.

16. The device of claim 15, wherein at least one of the first component or the second component includes an inductor.

17. The device of claim 1, wherein a particular conductive element of the second conductive elements is connected to at least two other conductive elements of the second conductive elements, and wherein the first conductive elements are physically interconnected.

18. The device of claim 1, wherein the particular conductive element of the first conductive elements forms a portion of a first conductive path of the first patterned layer, and wherein the particular conductive element is in contact with multiple conductive elements of the first conductive elements.

19. The device of claim 1, wherein the first pattern and the second pattern have an inverse arrangement of conductive elements with reference to a particular axis.

20. The device of claim 19, wherein the first patterned layer further includes dielectric material positioned between each of the first conductive elements, and wherein the dielectric material of the first patterned layer and the second conductive elements of the second patterned layer are substantially aligned with reference to the particular axis.

21. The device of claim 20, wherein the dielectric material of the first patterned layer and the second conductive elements of the second patterned layer have substantially the same size, have substantially the same shape, and have substantially the same position with reference to the particular axis.

22. A computer-readable medium storing instructions that are executable by a processor to perform operations comprising:
    initiating formation of a first patterned layer of a ground shield structure, the first patterned layer including first conductive elements electrically interconnected within the first patterned layer according to a first pattern, wherein a particular conductive element of the first conductive elements is connected to at least two other conductive elements of the first conductive elements; and
    initiating formation of a second patterned layer of the ground shield structure, the second patterned layer including second conductive elements electrically interconnected within the second patterned layer according to a second pattern, wherein a spacer is between the first patterned layer and the second patterned layer, and wherein the first pattern and the second pattern are complementary patterns.

23. The computer-readable medium of claim 22, wherein formation of the first patterned layer includes depositing conductive material on the spacer to form the first pattern and formation of the second patterned layer includes depositing conductive material on the spacer to form the second pattern.

24. A ground shield structure comprising:
    means for conducting charge, the means for conducting charge comprising a first layer of first electrically interconnected elements and a second layer of second electrically interconnected elements, the first layer of first electrically interconnected elements and the second layer of second electrically interconnected elements configured to electrically shield a first structure from an electric field associated with a second structure, wherein the first electrically interconnected elements are electrically interconnected within the first layer according to a first pattern, wherein the second electrically interconnected elements are electrically interconnected within the second layer according to a second pattern, wherein the first pattern and the second pattern are complementary patterns, and wherein a particular element of the first electrically interconnected elements is connected to at least two other elements of the first electrically interconnected elements; and
    means for impeding conduction of charge, the means for impeding conduction of charge located between the first layer of interconnected elements and the second layer of interconnected elements.

25. The ground shield structure of claim 24, wherein the first layer of first electrically interconnected elements and the second layer of second electrically interconnected elements are connected to ground, and wherein the second structure includes an inductor.

26. The ground shield structure of claim 24, wherein the first layer further includes dielectric material positioned between the first electrically interconnected elements, and wherein the dielectric material of the first layer and the second electrically interconnected elements of the second layer are substantially coextensive with reference to a particular axis.

27. A method of forming a ground shield structure, the method comprising:
    forming a first patterned layer of the ground shield structure, the first patterned layer including first conductive elements electrically interconnected within the first patterned layer according to a first pattern, wherein a particular conductive element of the first conductive elements is connected to at least two other conductive elements of the first conductive elements; and
    forming a second patterned layer of the ground shield structure, the second patterned layer including second conductive elements electrically interconnected within the second patterned layer according to a second pattern, wherein a spacer is located between the first patterned layer and the second patterned layer, and wherein the first pattern and the second pattern are complementary patterns.

28. The method of claim 27, further comprising coupling at least one of the first conductive elements and at least one of the second conductive elements to ground, wherein the first conductive elements are electrically interconnected such that an eddy current induced at a first portion of the first patterned layer flows to ground via a first ground connection and does not flow to ground via a second ground connection.

29. The method of claim 27, further comprising:
    receiving a data file including design information corresponding to an electronic device; and
    fabricating the electronic device according to the design information, wherein the electronic device includes the ground shield structure, and wherein fabricating the electronic device includes forming the first patterned layer and forming the second patterned layer.

30. The method of claim 29, wherein the data file has a GDSII format or a GERBER format.

* * * * *